United States Patent
Yang et al.

(10) Patent No.: US 9,961,427 B2
(45) Date of Patent: May 1, 2018

(54) DISPLAY PANEL AND PREPARATION METHOD THEREFOR, AND DISPLAY DEVICE AND HEALTH MONITORING METHOD THEREOF

(71) Applicants: BOE Technology Group Co., Ltd., Beijing (CN); Beijing BOE Optoelectronics Technology Co., Ltd., Beijing (CN)

(72) Inventors: Jiuxia Yang, Beijing (CN); Yun Qiu, Beijing (CN); Zhidong Wang, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 0 days. days.

(21) Appl. No.: 15/519,898

(22) PCT Filed: Feb. 3, 2016

(86) PCT No.: PCT/CN2016/073285
§ 371 (c)(1),
(2) Date: Apr. 18, 2017

(87) PCT Pub. No.: WO2017/045343
PCT Pub. Date: Mar. 23, 2017

(65) Prior Publication Data
US 2017/0251290 A1    Aug. 31, 2017

(30) Foreign Application Priority Data

Sep. 17, 2015 (CN) .......................... 2015 1 0595944

(51) Int. Cl.
*H04R 1/02*    (2006.01)
*G02F 1/1368*    (2006.01)
(Continued)

(52) U.S. Cl.
CPC ........... *H04R 1/028* (2013.01); *G02F 1/1368* (2013.01); *G02F 1/136227* (2013.01);
(Continued)

(58) Field of Classification Search
CPC ........ G02F 1/136227; G02F 1/136277; G02F 1/1368; H01L 27/1214; H01L 27/127;
(Continued)

(56) References Cited

U.S. PATENT DOCUMENTS

2002/0135708 A1    9/2002    Murden et al.
2002/0171636 A1    11/2002    Aarts et al.
(Continued)

FOREIGN PATENT DOCUMENTS

CN    1459043 A    11/2003
CN    1493169 A    4/2004
(Continued)

OTHER PUBLICATIONS

Sep. 29, 2017—(CN) First Office Action Appn 201510595944.2 with English Tran.
(Continued)

*Primary Examiner* — David Ton
(74) *Attorney, Agent, or Firm* — Banner & Witcoff, Ltd.

(57) ABSTRACT

A display panel and manufacturing method thereof, and a display device and health monitoring method thereof. The display panel includes a base substrate and a sonic sensor disposed on the base substrate. The sonic sensor is configured to monitor a sonic wave.

19 Claims, 3 Drawing Sheets

(51) Int. Cl.

| | |
|---|---|
| *G02F 1/1362* | (2006.01) |
| *G06F 3/16* | (2006.01) |
| *H03G 3/32* | (2006.01) |
| *H04R 31/00* | (2006.01) |
| *H04R 23/00* | (2006.01) |
| *H01L 27/32* | (2006.01) |
| *H01L 27/12* | (2006.01) |
| *H01L 29/786* | (2006.01) |
| *G08B 21/18* | (2006.01) |

(52) U.S. Cl.
CPC ........ *G02F 1/136277* (2013.01); *G06F 3/165* (2013.01); *G08B 21/182* (2013.01); *H01L 27/127* (2013.01); *H01L 27/1222* (2013.01); *H01L 27/3225* (2013.01); *H01L 27/3262* (2013.01); *H01L 29/78669* (2013.01); *H01L 29/78678* (2013.01); *H03G 3/32* (2013.01); *H04R 23/006* (2013.01); *H04R 31/00* (2013.01); *H04R 2201/003* (2013.01); *H04R 2499/15* (2013.01)

(58) Field of Classification Search
CPC ............. H01L 27/1222; H01L 27/3225; H01L 27/3262; H04R 31/00; H04R 2201/003; H04R 2499/15
See application file for complete search history.

(56) References Cited

U.S. PATENT DOCUMENTS

| | | |
|---|---|---|
| 2008/0048182 A1 | 2/2008 | Hatano |
| 2014/0209897 A1 | 7/2014 | Kubota et al. |
| 2014/0253613 A1 | 9/2014 | Gilbert |
| 2017/0016930 A1 | 1/2017 | Qiu et al. |

FOREIGN PATENT DOCUMENTS

| | | |
|---|---|---|
| CN | 1823551 A | 8/2006 |
| CN | 101620018 A | 1/2010 |
| CN | 102364413 A | 2/2012 |
| CN | 104067163 A | 9/2014 |
| CN | 105070720 A | 11/2015 |
| CN | 105182583 A | 12/2015 |
| CN | 204946489 U | 1/2016 |
| KR | 20070083002 A | 8/2007 |
| SU | 1697277 A1 | 12/1991 |

OTHER PUBLICATIONS

Jun. 14, 2016—International Search Report and Written Opinion Appn PCT/CN2016/073285 with Eng Tran.
Wide application of air pressure sensor, analysis and introduction of three major selling points http://www.chinabike.com/t/30918/2013/0919/1586809.html with Eng Tran.
Principles and application scope of TI Pressure Sensor SCP1000 http://www.chinabike.com/t/9675/2014/0318/1924630.html with Eng Tran.

DISPLAY PANEL AND PREPARATION METHOD THEREFOR, AND DISPLAY DEVICE AND HEALTH MONITORING METHOD THEREOF

The application is a U.S. National Phase Entry of International Application No. PCT/CN2016/073285 filed on Feb. 3, 2016, designating the United States of America and claiming priority to Chinese Patent Application No. 201510595944.2 filed on Sep. 17, 2015. The present application claims priority to and the benefit of the above-identified applications and the above-identified applications are incorporated by reference herein in their entirety.

TECHNICAL FIELD

Embodiments of the present disclosure relate to a display panel, a manufacturing method thereof, a display device and a health monitoring method thereof.

BACKGROUND

A voice execution function of a conventional display device such as a mobile phone and an iPAD is achieved by a microphone chip on a motherboard, and moreover, a microphone is manufactured by a micro-electromechanical system (MEMS) process, leading to a very complex manufacturing process of the entire display device. Hence, the production efficiency of the display device can be affected. For instance, a conventional integrated sonic sensor needs to be mounted on the motherboard, which may reduce the production efficiency of the display device, and is not beneficial for a thinning development of the display device.

SUMMARY

Embodiments of the present disclosure provide a display panel, a manufacturing method thereof, a display device and a health monitoring method thereof to improve a production efficiency of the display device and meanwhile promote a thinning development of the display device.

Embodiments of the present disclosure provide a display panel. The display panel includes a base substrate and a sonic sensor disposed on the base substrate. The sonic sensor is configured to monitor a sonic wave.

For instance, the sonic sensor includes: a first electrode layer disposed on the base substrate; a silicon backboard disposed on the first electrode layer; a supporting layer disposed on the silicon backboard; a first film layer disposed on the supporting layer; a second electrode layer disposed on the first film layer; and a second film layer disposed on the second electrode layer. For instance, the first film layer and the second film layer are Mylar film layers; and a connected sound hole is formed on the first electrode layer, the silicon backboard, the supporting layer and the first film layer.

For instance, the display panel further comprises a thin-film transistor (TFT) disposed on the base substrate. The TFT includes a gate layer, a gate insulating layer, a polysilicon active layer and a source/drain electrode layer. The TFT is disposed on a metal barrier layer of the base substrate and is isolated from the metal barrier layer through an insulating layer. For instance, the first electrode layer of the sonic sensor is arranged in the same layer with the metal barrier layer; the silicon backboard of the sonic sensor is arranged in the same layer with the polysilicon active layer in the TFT; the supporting layer of the sonic sensor is arranged in the same layer with the gate insulating layer of the TFT; and the second electrode layer of the sonic sensor is arranged in the same layer with the gate layer of the TFT.

For instance, material of the supporting layer is silicon dioxide or silicon nitride.

For instance, the first film layer and the second film layer each include a first silicon nitride layer, a polysilicon layer disposed on the first silicon nitride layer, and a second silicon nitride layer disposed on the polysilicon layer.

For instance, the base substrate, the first electrode layer, the silicon backboard, the supporting layer and the first film layer are each provided with a through hole at a same position, and respective through holes disposed on the base substrate, the first electrode layer, the silicon backboard, the supporting layer and the first film layer are connected to form the sound hole.

For instance, the display panel is a liquid crystal display (LCD) panel, and the LCD panel further comprises a first barrier layer, a first passivation layer, a second barrier layer, a first transparent conductive layer, a second passivation layer and a second transparent electrode layer that are disposed on the second film layer.

For instance, the display panel further comprises a TFT disposed on the base substrate, and the TFT includes a gate layer, a gate insulating layer, an amorphous silicon (a-Si) active layer and a source/drain electrode layer. For instance, the first electrode layer of the sonic sensor is arranged in the same layer with the gate layer of the TFT; the silicon backboard of the sonic sensor is arranged in the same layer with the a-Si active layer; and the second electrode layer of the sonic sensor is arranged in the same layer with the source/drain electrode layer of the TFT.

For instance, the first film layer and the second film layer each include a first silicon nitride layer, an a-Si layer disposed on the first silicon nitride layer, and a second silicon nitride layer disposed on the a-Si layer.

For instance, the base substrate, the first electrode layer, the silicon backboard, the supporting layer and the first film layer are each provided with a through hole at a same position, and respective through holes disposed on the base substrate, the first electrode layer, the silicon backboard, the supporting layer and the first film layer are connected to form a sound hole.

For instance, the display panel is an LCD panel, and the LCD panel further comprises a passivation layer and a transparent conductive layer that are disposed on the second film layer.

For instance, the sound hole is a straight through hole or a horn-shaped hole.

For instance, the display panel is an organic light-emitting diode (OLED) display panel.

Embodiments of the disclosure further provide a method for manufacturing a display panel. The method includes: forming a first electrode layer on a base substrate; forming a silicon backboard on the first electrode layer; forming a supporting layer on the silicon backboard; forming a first film layer on the supporting layer; forming a connected sound hole on the first film layer, the first electrode layer, the supporting layer and the silicon backboard; forming a second electrode layer on the first film layer; and forming a second film layer on the second electrode layer.

For instance, the method for manufacturing the display panel further comprises: forming an active layer of a thin-film transistor (TFT) by a patterning process in a process of forming the silicon backboard; and forming a gate layer of the TFT by another patterning process in a process of forming the second electrode layer.

For instance, the method for manufacturing the display panel further comprises: forming a gate layer by a patterning process in a process of forming the first electrode layer; and forming a source electrode and a drain electrode of TFT by another patterning process in a process of forming the second electrode layer.

Embodiments of the disclosure further provide a display device, comprising the display panel described above.

In embodiments of the disclosure, a structure of the sonic sensor is directly formed on the base substrate, so that the sonic sensor can be simultaneously formed in the process of forming other structures of the display panel. Hence, a manufacturing process of the display panel can be simplified and a production efficiency of the display device can be improved. Meanwhile, as the sonic sensor is directly formed on the base substrate, a thickness of the formed display device can be reduced, which is beneficial for the thinning development of the display device.

For instance, the sonic sensor of the display panel is used for health monitoring, and the display device further comprises: an alarm device; and a control device configured to receive a sound amplitude monitored by the sonic sensor of the display panel, compare the sound amplitude with a default threshold, and control the alarm device to give out an alarm when the sound amplitude exceeds the default threshold.

For instance, the control device is also configured to control the alarm device to give out another alarm when the sound amplitude is below another default threshold, and control a volume adjuster of the display device to increase the volume to be within a default range when a user selects to increase the volume.

Embodiments of the disclosure provide a health monitoring method of the display device, comprising:

monitoring the sound amplitude of the display device by the sonic sensor of the display device, and comparing the sound amplitude with the default threshold by the control device;

controlling the alarm device to give out an alarm when the sound amplitude exceeds the default threshold; and controlling the alarm device to give out another alarm when the sound amplitude is below another default threshold, and controlling the volume adjuster of the display device to increase the volume to be within a default range when a user selects to increase the volume.

BRIEF DESCRIPTION OF THE DRAWINGS

In order to illustrate the technical solutions in the embodiments of the present disclosure or the existing arts more clearly, the drawings need to be used in the description of the embodiments or the existing arts will be briefly described in the following; it is obvious that the drawings described below are only related to some embodiments of the present disclosure, for one ordinary skilled person in the art, other drawings can be obtained according to these drawings without making other inventive work.

REFERENCE NUMERALS OF THE ACCOMPANYING DRAWINGS

1—lower electrode 2—silicon backboard 3—electret 4—lower Mylar sensitive diaphragm 5—upper electrode 6—upper Mylar sensitive diaphragm 7—sound hole 10—thin film transistor (TFT) 11—gate layer 12—gate insulating layer 13—active layer 14—drain electrode 15—source electrode 16—passivation layer 17—metal barrier layer 18—separation layer 20—sonic sensor 21—first electrode layer 22—silicon backboard 23—supporting layer 24—first film layer 25—second film layer 26—second electrode layer 27—sound hole 271—first through hole 272—second through hole 273—third through hole 30—base substrate 40—transparent electrode layer

DETAILED DESCRIPTION

Hereafter, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

Figure 1:
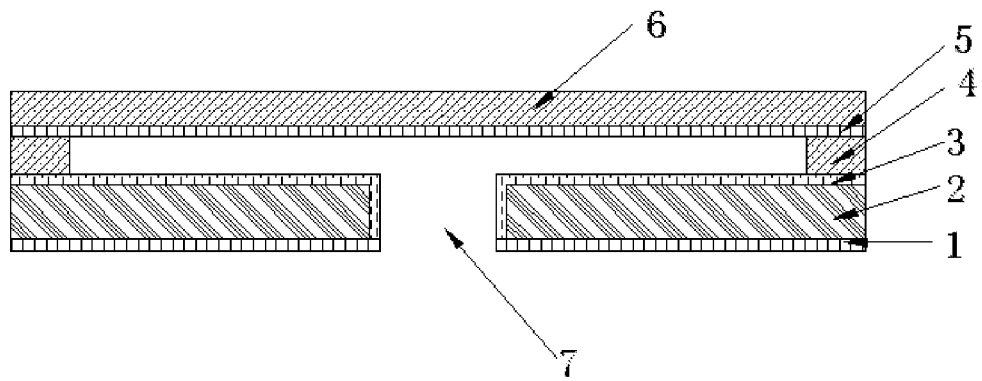
FIG. 1 is a schematic structural view of an example sonic sensor.

In some embodiments, FIG. 1 is a schematic structural view of an example sonic sensor. The sonic sensor comprises a lower electrode 1, a silicon backboard 2, an electret 3, a lower Mylar sensitive diaphragm 4, an upper electrode 5, an upper Mylar sensitive diaphragm 6 and a sound hole 7. For instance, the lower electrode 1 is disposed on the silicon backboard 2; the lower Mylar sensitive diaphragm 4 and the upper Mylar sensitive diaphragm 6 are disposed on two sides of the upper electrode 5, respectively; the electret 3 is configured to separate the upper electrode 5 from the lower electrodes 1; and the sound hole 7 is disposed on the electret 3, the lower electrode 1 and the silicon backboard 2.

In order to improve a production efficiency of display devices and meanwhile promote a thinning development of the display devices, embodiments of the present disclosure provide a display panel, a manufacturing method thereof, a display device and a health monitoring method thereof. In a technical proposal of embodiments of the present disclosure, a sonic sensor is manufactured on the display panel, so that the sonic sensor can be formed in the process of forming structures on the display panel. Hence, a manufacturing process of the display device can be simplified. Meanwhile, a thickness of the panel can be reduced, which is beneficial for the thinning development of the display device.

Figure 2:
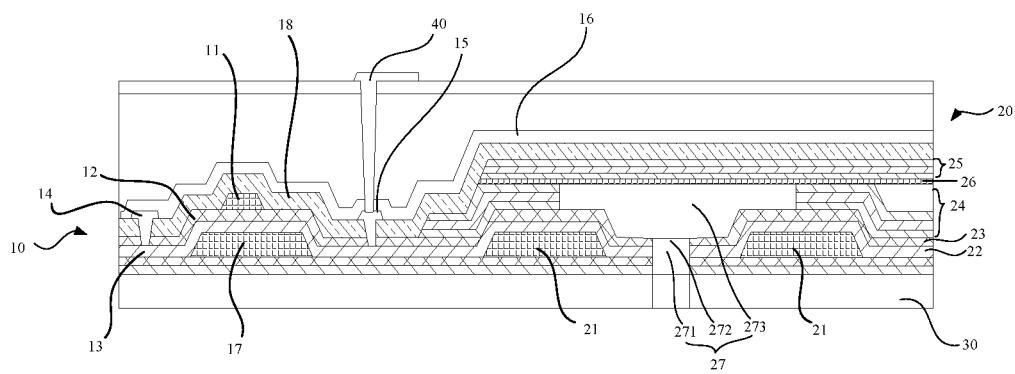
FIG. 2 is a schematic structural view of a display panel provided by an embodiment of the present disclosure.
Figure 3:
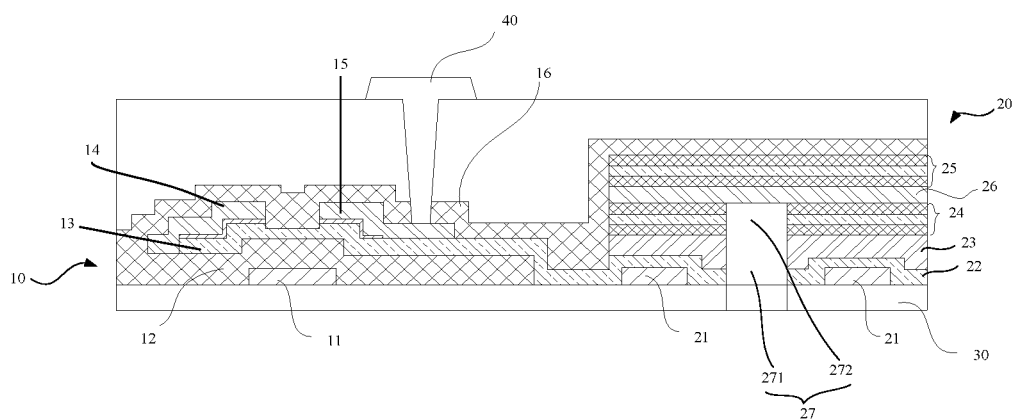
FIG. 3 is a schematic structural view of another display panel provided by an embodiment of the present disclosure.

For instance, FIGS. 2 and 3 are schematic structural views of different display panels provided by embodiments of the present disclosure.

Embodiments of the present disclosure provide a display panel. The display panel comprises a base substrate 30 and a sonic sensor 20 disposed on the base substrate 30.

In the embodiments, a structure of the sonic sensor 20 is directly formed on the base substrate 30, so that the sonic sensor 20 can be simultaneously formed in the process of forming other structures of the display panel. Hence, a manufacturing process of the display panel can be simplified and a production efficiency of the display device can be improved. Meanwhile, as the sonic sensor 20 is directly formed on the base substrate 30, a thickness of the formed display device can be reduced, which is beneficial for the thinning development of the display device.

For instance, the sonic sensor 20 includes: a first electrode layer 21 disposed on the base substrate 30; a silicon backboard 22 disposed on the first electrode layer 21; a supporting layer 23 disposed on the silicon backboard 22; a first film layer 24 disposed on the supporting layer 23; a second electrode layer 26 disposed on the first film layer 24; and a second film layer 25 disposed on the second electrode layer 26. For instance, the first film layer 24 and the second film layer 25 are Mylar film layers, and a connected sound hole 27 is formed on the first electrode layer 21, the silicon backboard 22, the supporting layer 23 and the first film layer 24.

For clear understanding of the embodiments of the present disclosure, detailed description will be given below to the structure of the display panel with reference to the example embodiments.

First Embodiment

The display panel provided by the embodiment of the present disclosure comprises a TFT 10 and a sonic sensor 20. The TFT 10 may have a top-gate structure. The structure of the TFT includes: an active layer 13, a gate insulating layer 12 disposed on the active layer 13, a gate layer 11 disposed on the gate insulating layer 12, a separation layer 18 disposed on the gate layer 11, and a source electrode 15 and a drain electrode 14 disposed on the separation layer 18.

For instance, as shown in FIG. 2, the TFT 10 in the display panel provided by the embodiment includes a gate layer 11, a gate insulating layer 12, a polysilicon active layer (e.g., an active layer 13) and a source/drain electrode layer (e.g., a source electrode 15 and a drain electrode 14). The TFT 10 is disposed on a metal barrier layer 17 which is on the base substrate, and is electrically isolated from the metal barrier layer 17 through an insulating layer. For instance, the first electrode layer 21 of the sonic sensor 20 is arranged in the same layer with the metal barrier layer 17; the silicon backboard 22 of the sonic sensor 20 is arranged in the same layer with the polysilicon active layer 13 in the TFT 10; the supporting layer 23 of the sonic sensor 20 is arranged in the same layer with the gate insulating layer 12 of the TFT 10; and the second electrode layer 26 of the sonic sensor 20 is arranged in the same layer with the gate layer 11 of the TFT 10.

Therefore, in the embodiment of the present disclosure, as the sonic sensor 20 can be simultaneously formed in the process of forming the TFT 10, a separate manufacturing process of the sonic sensor 20 can be reduced, and hence the production structure and the production process of the display panel can be simplified.

For instance, the material of the supporting layer 23 may be silicon dioxide or silicon nitride.

For instance, the first film layer 24 and the second film layer 25 in the sonic sensor 20 each include a first silicon nitride layer disposed on a first silicon oxide layer, a second polysilicon layer disposed on the first silicon nitride layer, and a second silicon nitride layer disposed on the second polysilicon layer.

In a process of forming the sound hole 27, the base substrate 30, the first electrode layer 21, the silicon backboard 22, the supporting layer 23 and the first film layer 24 are each provided with a through hole at a substantially same position. The through holes disposed on the base substrate 30, the first electrode layer 21, the silicon backboard 22, the supporting layer 23 and the first film layer 24 are connected to form the sound hole. For instance, as shown in FIG. 2, the sound hole 27 is disposed on the silicon backboard 22, the first electrode layer 21, the supporting layer 23 and the first film layer 24, and a specific structure of the sound hole may be a straight through-hole structure or may be a horn-mouth structure. For instance, when the sound hole 27 adopts the horn-mouth structure, the sound hole 27 includes a first through hole 271 formed on the silicon backboard 22, a second through hole 272 formed on the supporting layer 23, and a third through hole 273 formed on the first film layer 24. The third through hole 273 have a shape of a horn mouth. The third through hole 273, the second through hole 272 and the first through hole 271 are connected. The first electrode 21 adopt spaced metal strips; the supporting layer 23 is filled between two metal strips and makes contact with the silicon backboard 22; and the second through hole 272 and the first through hole 271 are disposed at positions between the two metal strips.

For instance, in order to improve the safety of the entire structure of the display panel, the display panel provided by the embodiment of the present disclosure may further comprise a passivation layer 16 covering the TFT 10 and the sonic sensor 20. The passivation layer 16 may protect the TFT 10 and the sonic sensor 20. Of course, the display panel provided by the embodiment of the present disclosure may further comprise a transparent electrode layer 40 disposed on the passivation layer 16 and connected with the source electrodes 15.

For instance, the display panel may be an LCD panel. The LCD panel may comprise a first barrier layer, a first passivation layer, a second barrier layer, a first transparent conductive layer, a second passivation layer and a second transparent electrode layer that are disposed on the second film layer.

As it can be seen from the above description, the display panel provided by the embodiment of the present disclosure adopts a configuration structure in which the TFT 10 and the sonic sensor 20 are arranged side by side, so that the manufacturing process of the display panel can be simplified and the sonic sensor 20 can be manufactured in the process of manufacturing the TFT 10. Moreover, as the TFT 10 and the sonic sensor 20 are arranged side by side, in the display panel provided by the embodiment a thickness of the display panel can be reduced, which promotes the thinning development of the display device.

Second Embodiment

As illustrated in FIG. 3, the display panel provided by the embodiment comprises a TFT 10 and a sonic sensor 20. The TFT 10 have a bottom-gate structure. The structure of the TFT may include: a gate layer 11, a gate insulating layer 12 disposed on the gate layer 11, an active layer 13 disposed on the gate insulating layer 12, and a source electrode 15 and a drain electrode 14 disposed on the active layer 13. For instance, the TFT 10 includes a gate layer 11, a gate insulating layer 12, an amorphous silicon (a-Si) active layer 13 and a source/drain electrode layer (e.g., a source electrode 15 and a drain electrode 14). For instance, a first electrode layer 21 of the sonic sensor 20 is arranged in the same layer with the gate layer 11 of the TFT 10; a silicon backboard 22 of the sonic sensor 20 is arranged in the same layer with the a-Si active layer 13 in the TFT 10; and a second electrode layer 26 of the sonic sensor 20 is arranged in the same layer with the source/drain electrode layer of the TFT 10.

For instance, a supporting layer 23 includes a silicide layer arranged in the same layer with the formed active layer 13 of the TFT 10 and a silicon oxide layer disposed on the silicide layer. That is to say, in the process of forming the active layer 13, the silicide layer disposed on the first electrode layer 21 is taken as one part of the supporting layer 23, and a silicon oxide layer is disposed on the supporting layer 23. The silicide layer and the silicon oxide layer together serve as the supporting layer 23.

For instance, the second electrode layer 26 is arranged in the same layer with the source electrode 15 and the drain electrode 14 of the TFT 10.

For instance, the first film layer 24 and the second film layer 25 each include a first silicon nitride layer, an a-Si layer disposed on the first silicon nitride layer, and a second silicon nitride layer disposed on the a-Si layer.

As it can be seen from the above structure, the sonic sensor 20 is synchronously manufactured in the process of manufacturing the TFT 10, so that the manufacturing process of the display panel can be reduced and the production efficiency of the display panel can be improved. Meanwhile, as the TFT 10 and the sonic sensor 20 are arranged side by side, the thickness of the display panel can be reduced, which is beneficial for the thinning development of the display device.

In the process of forming the sound hole 27, the base substrate 30, the first electrode layer 21, the silicon backboard 22, the supporting layer 23 and the first film layer 24 are each provided with a through hole at the same position, and the through holes disposed on the base substrate 30, the first electrode layer 21, the silicon backboard 22, the supporting layer 23 and the first film layer 24 are connected to form the sound hole. For instance, the sound hole 27 is disposed on the silicon backboard 22, the first electrode layer 21, the supporting layer 23 and the first film layer 24, and a specific structure of the sound hole 27 may adopt a straight through-hole structure or may also adopt a horn-mouth structure. As illustrated in FIG. 3, the sound hole 27 adopts the straight through-hole structure, namely the sound hole includes a first through hole 271 formed on the silicon backboard 22 and the supporting layer 23 and a second through hole 272 formed on the first film layer 24; the second through hole 272 and the first through hole 271 are connected; the first electrode layer 21 adopts spaced metal strips; the supporting layer 23 is filled between two metal strips and makes contact with the silicon backboard 22; and the second through hole 272 and the first through hole 271 are disposed at positions between the two metal strips.

For instance, in order to improve the safety of the entire structure on the display panel, the display panel provided by the embodiment of the present disclosure further comprises a passivation layer 16 covering the TFT 10 and the sonic sensor 20. The passivation layer 16 may protect the TFT 10 and the sonic sensor 20. Of course, the display panel provided by the embodiment further comprises a transparent electrode layer 40 disposed on the passivation layer 16 and connected with the source electrodes 15.

For instance, the display panel provided by the embodiment is an LCD panel. The LCD panel further comprises a passivation layer and a transparent conductive layer that are disposed on the second film layer.

In another example, the display panel provided by the embodiment is an OLED display panel.

For more clear understanding of the display panel provided by the embodiment of the present disclosure, the embodiment of the present disclosure further provides a method for manufacturing a display panel. The method comprises the following steps:
forming a first electrode layer on a base substrate;
forming a silicon backboard on the first electrode layer;
forming a supporting layer on the silicon backboard;
forming a first film layer on the supporting layer;
forming a connected sound hole on the first film layer, the first electrode layer, the supporting layer and the silicon backboard which are formed above;
forming a second electrode layer on the first film layer; and
forming a second film layer on the second electrode layer.

As it can be seen from the above method, the sonic sensor is directly manufactured on the base substrate, so that the sonic sensor can be simultaneously formed in the process of forming other structures of the display panel, and hence the manufacturing process of the display panel can be simplified and the production efficiency of the display device can be improved. Meanwhile, as the sonic sensor is directly formed on the base substrate, the thickness of the formed display device can be reduced, which is beneficial for the thinning development of the display device.

For instance, the method comprises: forming a first electrode layer on a base substrate; forming a silicon backboard on the first electrode layer; forming a supporting layer on the silicon backboard; forming a first film layer on the supporting layer; forming a connected sound hole on the first film layer, the first electrode layer, the supporting layer and the silicon backboard which are formed above; forming a second electrode layer on the first film layer; and forming a second film layer on the second electrode layer.

For more clear understanding of the method, detailed description will be given below to the method with reference to example embodiments.

Third Embodiment

Figure 4:
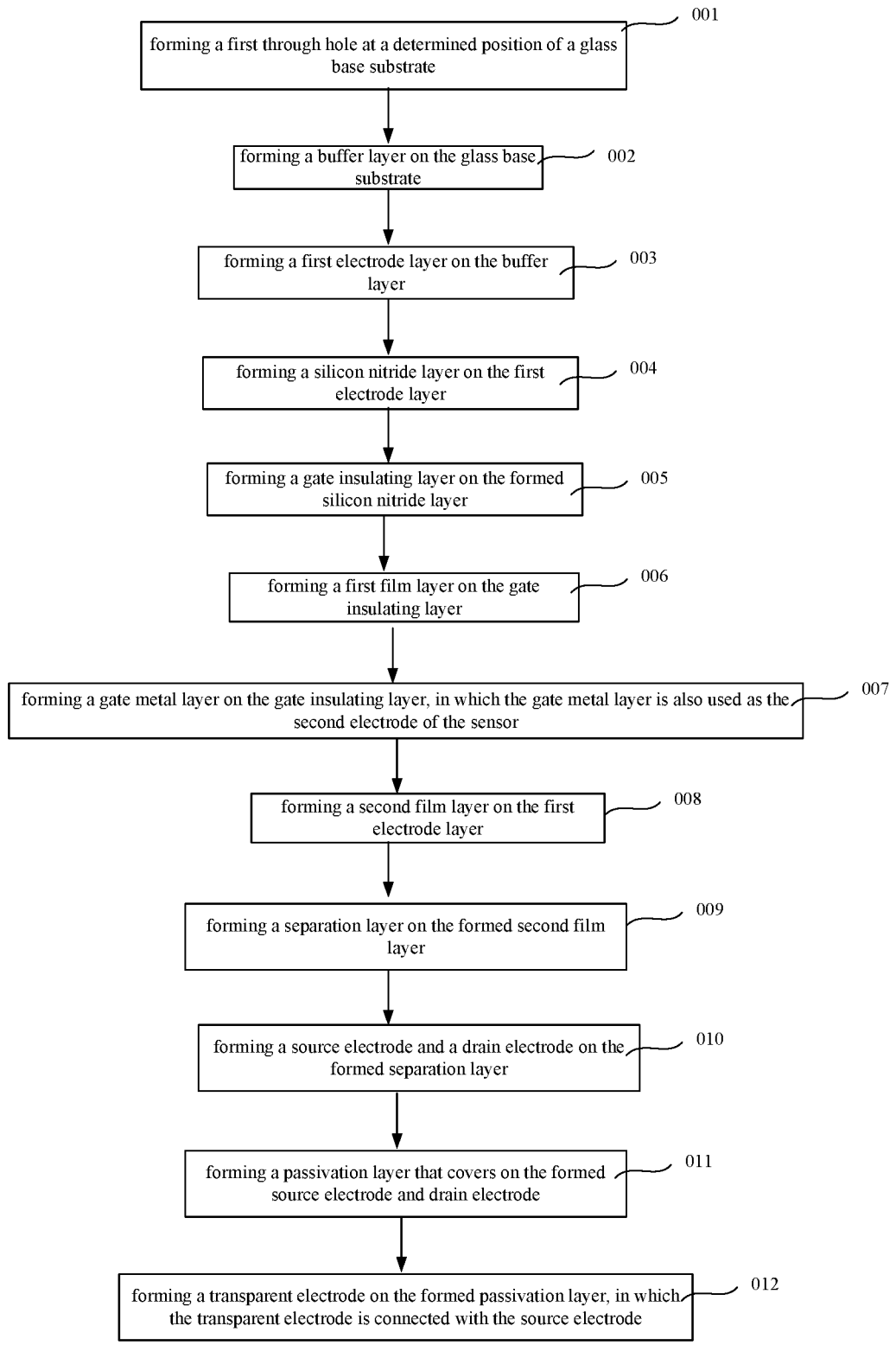
FIG. 4 is a flowchart of a method for manufacturing a display panel provided by an embodiment of the present disclosure.

A manufacturing method provided by the embodiment may be used for manufacturing the display panel provided by the first embodiment. As illustrated in FIG. 4, the manufacturing method comprises:

Step S001: forming a first through hole at a determined position of a glass base substrate.

Step S002: forming a buffer layer on the glass base substrate.

Step S003: forming a first electrode layer on the buffer layer. For instance, the first electrode layer includes a plurality of spaced metal strip electrodes.

Step S004: forming a silicon nitride layer on the first electrode layer. For instance, the silicon nitride layer may be used as the active layer of the TFT and the silicon backboard of the sonic sensor.

Step S005: forming a gate insulating layer on the formed silicon nitride layer. For instance, the gate insulating layer is also used as the electret (or the supporting layer) of the sonic sensor, and meanwhile, a second through hole is formed by utilization of photolithography and development; and the gate insulating layer is a first silicon oxide layer.

Step S006: forming a first film layer on the gate insulating layer.

For instance, the first film layer is disposed on the first electrode. Moreover, the first film layer includes: a first silicon nitride layer disposed on the first silicon oxide layer, a second polysilicon layer disposed on the first silicon nitride layer, and a second silicon nitride layer disposed on the second polysilicon layer. A third through hole may be formed on the first film layer by a lithography process. The first through hole, the second through hole and the third through hole may be connected to form a sound hole.

Step S007: forming a gate metal layer on the gate insulating layer, in which the gate metal layer is also used as the second electrode of the sensor.

For instance, the gate metal layer is formed on the gate insulating layer, and the formed gate metal layer is etched to form the gate layer and the second electrode according to the structure of the TFT and the structure of the sonic sensor.

Step S008: forming a second film layer on the first electrode layer.

For instance, the structure of the second film layer is the same as that of the first film layer, namely the second film layer may be formed by sandwiching a polysilicon layer between two silicon oxide layers.

Step S009: forming a separation layer on the formed second film layer.

Step S010: forming a source electrode and a drain electrode on the formed separation layer.

Step S011: forming a passivation layer that covers on the formed source electrode and drain electrode.

For instance, the passivation layer covers the TFT and the sonic sensor.

Step S012: forming a transparent electrode on the formed passivation layer, in which the transparent electrode is connected with the source electrode.

Fourth Embodiment

Figure 5:
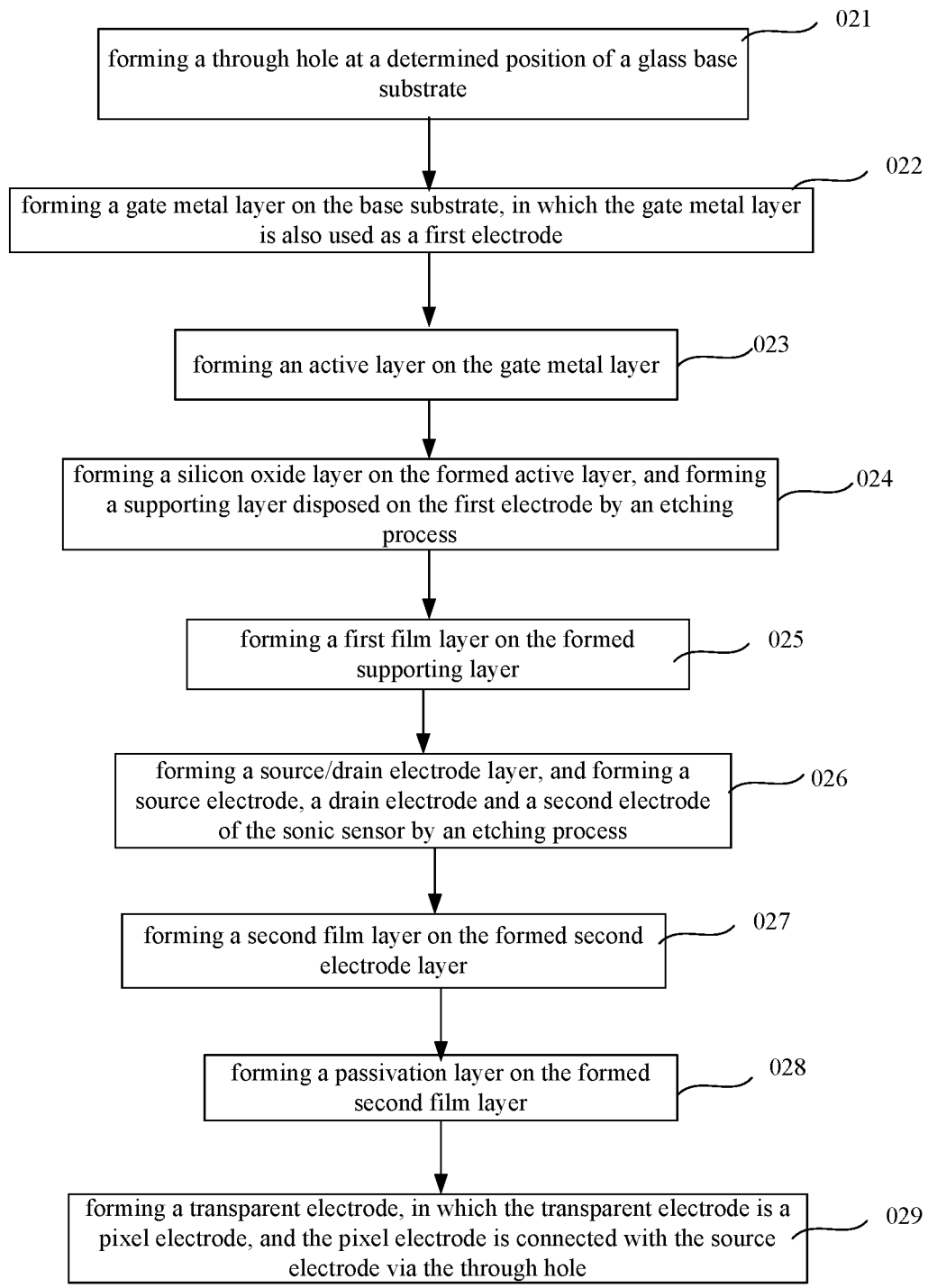
FIG. 5 is a flowchart of a method for manufacturing a display panel provided by another embodiment of the present disclosure.

A manufacturing method provided by the embodiment may be used for manufacturing the display panel provided by the second embodiment, where the display panel adopts a bottom-gate structure. As illustrated in FIG. 5, the method comprises:

Step S021: forming a through hole at a determined position of a glass base substrate.

Step S022: forming a gate metal layer on the base substrate, in which the gate metal layer is also used as a first electrode.

For instance, the gate metal layer is formed on the base substrate, and the formed gate metal layer is etched to form the gate layer and the first electrode according to the structure of the TFT and the structure of the sonic sensor.

Step S023: forming an active layer on the gate metal layer.

For instance, the step S023 may include: depositing a-Si; forming N-doped a-Si by deposition on the formed a-Si; and forming the active layer by a lithography process.

Step S024: forming a silicon oxide layer on the formed active layer, and forming a supporting layer disposed on the first electrode by an etching process.

Step S025: forming a first film layer on the formed supporting layer.

For instance, the first film layer is formed by sandwiching one polysilicon layer between two silicon oxide layers.

Step S026: forming a source/drain electrode layer, and forming a source electrode, a drain electrode and a second electrode of the sonic sensor by an etching process.

Step S027: forming a second film layer on the formed second electrode layer.

For instance, the structure of the second film layer is the same as that of the first film layer, namely the second film layer may be formed by sandwiching one polysilicon layer between two silicon oxide layers.

Step S028: forming a passivation layer on the formed second film layer.

For instance, the passivation layer is formed on the formed second film layer and covers the TFT. The step S028 may further include: forming a through hole in the passivation layer by a lithography process.

Step S029: forming a transparent electrode, in which the transparent electrode is a pixel electrode, and the pixel electrode is connected with the source electrode via the through hole.

As it can be seen from the method for manufacturing the display panel provided by the third embodiment and the fourth embodiment, in the method for manufacturing the display panel provided by the embodiments of the present disclosure, the sonic sensor is directly manufactured on the base substrate, so that the sonic sensor can be simultaneously formed in the process of forming other structures of the display panel, and hence the manufacturing process of the display panel can be simplified and the production efficiency of the display device can be improved. Meanwhile, as the sonic sensor is directly formed on the base substrate, the thickness of the formed display device can be reduced, which is beneficial for the thinning development of the display device.

An embodiment of the present disclosure further provides a display device. The display device comprises any foregoing display panel.

In the embodiment, as the structure of the sonic sensor is directly formed on the base substrate, the sonic sensor can be simultaneously formed in the process of forming other structures of the display panel, and hence the manufacturing process of the display panel can be simplified and the production efficiency of the display device can be improved. Meanwhile, as the sonic sensor is directly formed on the base substrate, the thickness of the formed display device can be reduced, which is beneficial for the thinning development of the display device.

In some embodiments, the sonic sensor of the display panel is used for health monitoring. The display device further comprises:

an alarm device; and a control device configured to receive a sound amplitude monitored by the sonic sensor of the display panel, compare the sound amplitude with a default threshold, and control the alarm device to give out an alarm when the sound amplitude exceeds the default threshold.

For instance, when the sound amplitude monitored by the display device exceeds the default threshold set for a system, a suggestion instruction may be given out to prompt a user that a current volume is higher than a safe volume threshold, the volume at this point may damage the eardrum, and a hearing ability may be affected when the user is exposed to the volume for a long time.

The health monitoring and alarm function of the display panel integrated with the sonic sensor provided by the present disclosure may refer to monitoring a volume. The control device is also configured to control the alarm device to give out an alarm when the sound amplitude is below a default threshold, and control a volume adjuster of the display device to increase the volume to be within a default range when the user selects to increase the volume.

For instance, when the sound amplitude monitored by the display device is below a default threshold of the system, an alarm may also be given out to prompt the user that the current volume is lower than a minimum volume threshold for the user to listen to and prompt the user whether he or she allows the system to automatically adjust the volume. When an instruction indicating that the user needs to adjust the volume is received, the system may automatically adjust the volume to be within a safe default range according to the user instruction; and when an instruction indicating that the user does not need to adjust the volume is received, the system may ignore the alarm.

The present disclosure further provides a health monitoring method of the display device, which comprises the following steps:

monitoring a sound amplitude of the display device via the sonic sensor of the display device, comparing the sound amplitude with a default threshold via the control device, and controlling the alarm device to give out an alarm when the sound amplitude exceeds the default threshold.

In the above step, a use experience of the user can be improved by detecting the sound via the sonic sensor and giving out an alarm when the sound exceeds the default threshold.

The health monitoring method may further comprise: controlling the alarm device to give out an alarm when the sound amplitude is below another default threshold, and controlling the volume adjuster of the display device to increase the volume to be within a default range when the user selects to increase the volume.

In the above step, the detection of the sound via the sonic sensor and the control of the volume via the control device provide convenience for the user.

It's to be noted that, in the drawings, for the clarity of the drawings the sizes of layers and areas may be exaggerated. And it can be understood, in the case that a component or a layer called "on" another element or layer, it can be directly on the top of the other elements, or can exist in the middle layer. Besides, it can be understood that, in the case that a component or a layer called "under" another element or layer, it can be directly under the other components, or there are at least two intermediate layers or elements. Besides, it can also be understood that, in the case that a layer or a component called "between" two layers or two elements, it can be the only layer of the two layers or two components, or it also exists at least two intermediate layers or elements. The similar reference marks indicate similar components in the whole text.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects.

It is noted that, azimuth or positional relationships indicated by terms such as "up" and "down" and so on, are azimuth or positional relationships based on the drawings, which are only to facilitate description of the embodiments of the present disclosure and simplify the description, but not to indicate or imply that the devices or components must have a specific azimuth, or be constructed or operated in the specific azimuth, which thus cannot be understood as a limitation to the embodiments of the present disclosure. Unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. Those skilled in the art can understand the specific meanings of the above-mentioned terms in the embodiments of the present disclosure according to the specific circumstances.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201510595944.2 filed on Sep. 17, 2015, which is incorporated herein by reference in its entirety as part of the disclosure of the present application.

What is claimed is:

1. A display panel, comprising:
   a base substrate; and
   a sonic sensor disposed on the base substrate, wherein the sonic sensor is configured to monitor a sonic wave;
   wherein the sonic sensor includes:
      a first electrode layer disposed on the base substrate;
      a silicon backboard disposed on the first electrode layer;
      a supporting layer disposed on the silicon backboard;
      a first film layer disposed on the supporting layer;
      a second electrode layer disposed on the first film layer; and
      a second film layer disposed on the second electrode layer,
      wherein the first film layer and the second film layer are Mylar film layers; and a connected sound hole is formed on the first electrode layer, the silicon backboard, the supporting layer and the first film layer.

2. The display panel according to claim 1, further comprising a thin-film transistor (TFT) disposed on the base substrate, wherein:
   the TFT includes a gate layer, a gate insulating layer, a polysilicon active layer and a source/drain electrode layer;
   the TFT is disposed on a metal barrier layer of the base substrate and is isolated from the metal barrier layer through an insulating layer;
   the first electrode layer of the sonic sensor is arranged in the same layer with the metal barrier layer;
   the silicon backboard of the sonic sensor is arranged in the same layer with the polysilicon active layer in the TFT;
   the supporting layer of the sonic sensor is arranged in the same layer with the gate insulating layer of the TFT; and
   the second electrode layer of the sonic sensor is arranged in the same layer with the gate layer of the TFT.

3. The display panel according to claim 1, wherein material of the supporting layer is silicon dioxide or silicon nitride.

4. The display panel according to claim 1, wherein the first film layer and the second film layer each include a first silicon nitride layer, a polysilicon layer disposed on the first silicon nitride layer, and a second silicon nitride layer disposed on the polysilicon layer.

5. The display panel according to claim 1, wherein the base substrate, the first electrode layer, the silicon backboard, the supporting layer and the first film layer are each provided with a through hole at a same position, and respective through holes disposed on the base substrate, the first electrode layer, the silicon backboard, the supporting layer and the first film layer are connected to form the connected sound hole.

6. The display panel according to claim 1, wherein the display panel is a liquid crystal display (LCD) panel, and the LCD panel further comprises a first barrier layer, a first passivation layer, a second barrier layer, a first transparent conductive layer, a second passivation layer and a second transparent electrode layer that are disposed on the second film layer.

7. The display panel according to claim 1, wherein the display panel further comprises a TFT disposed on the base substrate, and the TFT includes a gate layer, a gate insulating layer, an amorphous silicon (a-Si) active layer and a source/drain electrode layer;
the first electrode layer of the sonic sensor is arranged in the same layer with the gate layer of the TFT;
the silicon backboard of the sonic sensor is arranged in the same layer with the a-Si active layer; and
the second electrode layer of the sonic sensor is arranged in the same layer with the source/drain electrode layer of the TFT.

8. The display panel according to claim 7, wherein the first film layer and the second film layer each include a first silicon nitride layer, an a-Si layer disposed on the first silicon nitride layer, and a second silicon nitride layer disposed on the a-Si layer.

9. The display panel according to claim 7, wherein the base substrate, the first electrode layer, the silicon backboard, the supporting layer and the first film layer are each provided with a through hole at a same position, and respective through holes disposed on the base substrate, the first electrode layer, the silicon backboard, the supporting layer and the first film layer are connected to form the connected sound hole.

10. The display panel according to claim 7, wherein the display panel is an LCD panel, and the LCD panel further comprises a passivation layer and a transparent conductive layer that are disposed on the second film layer.

11. The display panel according to claim 1, wherein the connected sound hole is a straight through hole or a horn-shaped hole.

12. The display panel according to claim 1, wherein the display panel is an organic light-emitting diode (OLED) display panel.

13. A method for manufacturing the display panel according to claim 1, comprising:
forming the first electrode layer on the base substrate;
forming the silicon backboard on the first electrode layer;
forming the supporting layer on the silicon backboard;
forming the first film layer on the supporting layer;
forming the connected sound hole on the first film layer, the first electrode layer, the supporting layer and the silicon backboard;
forming the second electrode layer on the first film layer; and
forming the second film layer on the second electrode layer.

14. The method for manufacturing the display panel according to claim 13, further comprising:
forming an active layer of a thin-film transistor (TFT) by a patterning process in a process of forming the silicon backboard; and
forming a gate layer of the TFT by another patterning process in a process of forming the second electrode layer.

15. The method for manufacturing the display panel according to claim 13, further comprising:
forming a gate layer by a patterning process in a process of forming the first electrode layer; and
forming a source electrode and a drain electrode of TFT by another patterning process in a process of forming the second electrode layer.

16. A display device, comprising a display panel, wherein the display panel comprises:
a base substrate; and
a sonic sensor disposed on the base substrate, wherein the sonic sensor is configured to monitor a sonic wave;
wherein the sonic sensor includes:
a first electrode layer disposed on the base substrate;
a silicon backboard disposed on the first electrode layer;
a supporting layer disposed on the silicon backboard;
a first film layer disposed on the supporting layer;
a second electrode layer disposed on the first film layer; and
a second film layer disposed on the second electrode layer,
wherein the first film layer and the second film layer are Mylar film layers; and a connected sound hole is formed on the first electrode layer, the silicon backboard, the supporting layer and the first film layer.

17. The display device according to claim 16, wherein the sonic sensor of the display panel is used for health monitoring, and the display device further comprises:
an alarm device; and
a control device configured to receive a sound amplitude monitored by the sonic sensor of the display panel, compare the sound amplitude with a default threshold, and control the alarm device to give out an alarm when the sound amplitude exceeds the default threshold.

18. The display device according to claim 17, wherein the control device is also configured to control the alarm device to give out another alarm when the sound amplitude is below another default threshold, and control a volume adjuster of the display device to increase the volume to be within a default range when a user selects to increase the volume.

19. A health monitoring method of the display device according to claim 17, comprising:
monitoring the sound amplitude of the display device by the sonic sensor of the display device, and comparing the sound amplitude with the default threshold by the control device;
controlling the alarm device to give out an alarm when the sound amplitude exceeds the default threshold; and
controlling the alarm device to give out another alarm when the sound amplitude is below another default threshold, and controlling a volume adjuster of the display device to increase the volume to be within a default range when a user selects to increase the volume.

* * * * *